(12) United States Patent
Aulnette et al.

(10) Patent No.: US 8,324,075 B2
(45) Date of Patent: Dec. 4, 2012

(54) METHODS FOR RECYCLING SUBSTRATES AND FABRICATING LAMINATED WAFERS

(75) Inventors: Cecile Aulnette, Guilderland, NY (US); Khalid Radouane, Carrieres sur Seine (FR)

(73) Assignee: Soitec, Bernin (FR)

( * ) Notice: Subject to any disclaimer, the term of this patent is extended or adjusted under 35 U.S.C. 154(b) by 340 days.

(21) Appl. No.: 12/663,254

(22) PCT Filed: Jun. 24, 2008

(86) PCT No.: PCT/EP2008/005107
§ 371 (c)(1),
(2), (4) Date: Dec. 4, 2009

(87) PCT Pub. No.: WO2009/007003
PCT Pub. Date: Jan. 15, 2009

(65) Prior Publication Data
US 2010/0181653 A1    Jul. 22, 2010

(30) Foreign Application Priority Data

Jul. 11, 2007 (EP) .................................... 07290869
May 28, 2008 (EP) .................................... 08290490

(51) Int. Cl.
*H01L 21/30* (2006.01)
*H01L 21/302* (2006.01)

(52) U.S. Cl. ........ 438/455; 438/406; 438/458; 438/459; 438/690; 438/692; 257/618; 257/629; 257/632; 257/E21.122; 257/E21.346; 257/E21.567; 257/E21.568

(58) Field of Classification Search .................. 438/406, 438/455, 458, 459, 690, 692; 257/618, 629, 257/632, E21.122, E21.346, E21.567, E21.568
See application file for complete search history.

(56) References Cited

U.S. PATENT DOCUMENTS
5,834,812 A * 11/1998 Golland et al. ............... 257/347
(Continued)

FOREIGN PATENT DOCUMENTS
CN          1959952 A        5/2007
(Continued)

OTHER PUBLICATIONS

Chinese Office Action for Chinese Application No. 200880021382.9 dated Jan. 26, 2011, 3 pages.
(Continued)

*Primary Examiner* — Dao H Nguyen
(74) *Attorney, Agent, or Firm* — TraskBritt

(57) ABSTRACT

The invention relates to a method for recycling a substrate with a step-like residue in a first region of its surface, in particular along the edge of the substrate, which protrudes with respect to the surface of a remaining second region of the substrate, and wherein the first region comprises a modified zone, in particular an ion implanted zone, essentially in a plane corresponding to the plane of the surface of the remaining second region of the substrate and/or chamfered towards the edge of the substrate. To prevent the negative impact of contaminants in subsequent laminated wafer fabricating processes, the recycling method comprises a material removal step which is carried out such that the surface of the substrate in the first region is lying lower than the level of the modified zone before the material removal. The invention also relates to a laminated wafer fabricating method using the recycled substrate and to a recycled substrate in which the surface of a first region lies lower than the surface of the second region.

19 Claims, 5 Drawing Sheets

U.S. PATENT DOCUMENTS

Figure 2B:
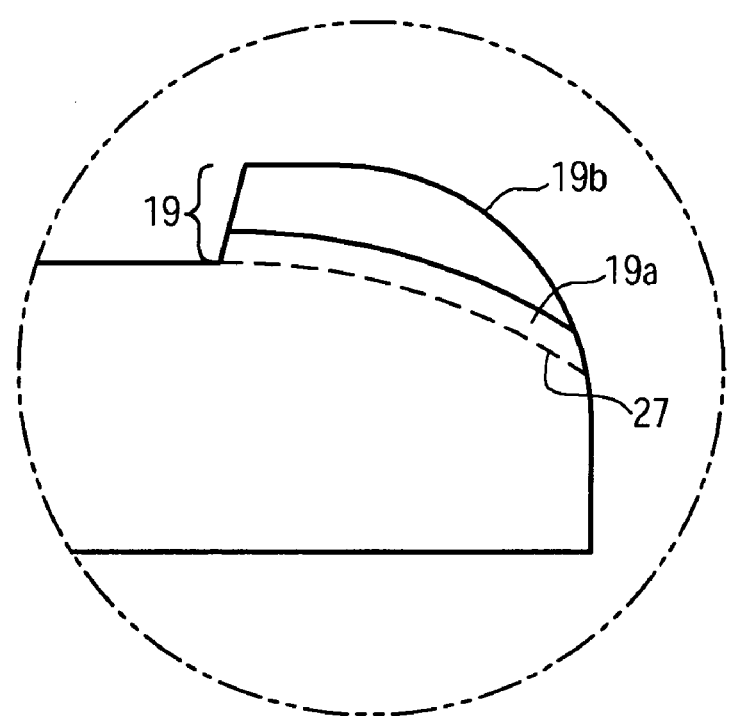
Figure 2D:
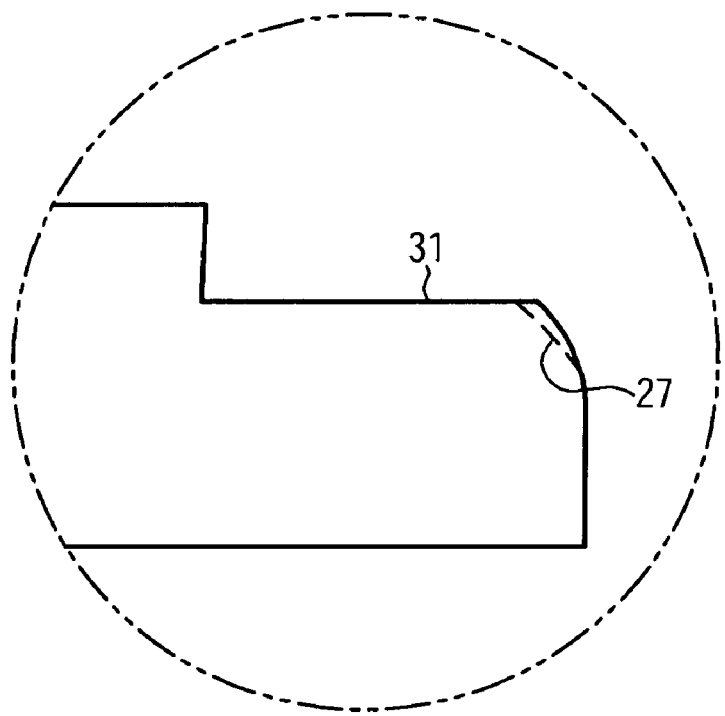

| | | |
|---|---|---|
| 6,596,610 B1 | 7/2003 | Kuwabara et al. |
| 7,022,586 B2 | 4/2006 | Maleville et al. |
| 7,176,102 B2 * | 2/2007 | Aga et al. .................. 438/406 |
| 7,572,714 B2 | 8/2009 | Aulnette |
| 2006/0115986 A1 | 6/2006 | Donohoe et al. |
| 2007/0023867 A1 * | 2/2007 | Aulnette et al. ............ 257/618 |
| 2007/0087526 A1 * | 4/2007 | Chhaimi et al. ............. 438/455 |
| 2008/0124929 A1 * | 5/2008 | Okuda et al. ................ 438/692 |

FOREIGN PATENT DOCUMENTS

| | | |
|---|---|---|
| EP | 1059663 A | 12/2000 |
| FR | 2852445 | 9/2004 |
| FR | 2888400 A1 | 1/2007 |
| FR | 2892228 A | 4/2007 |
| JP | 11297583 A | 10/1999 |
| WO | 2004081974 A2 | 9/2004 |

OTHER PUBLICATIONS

International Search Report for PCT/EP2008/005107 dated Nov. 3, 2008.

* cited by examiner

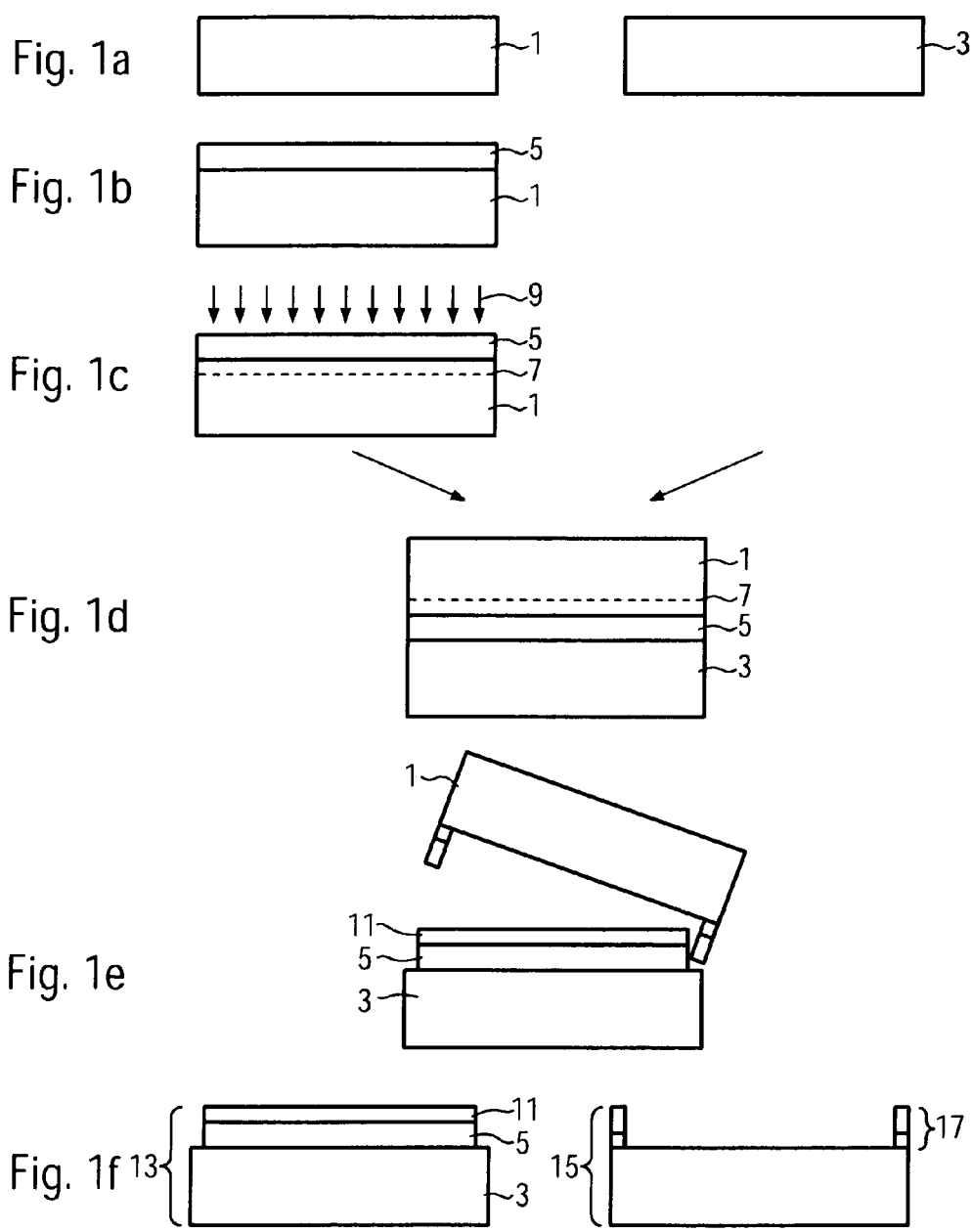

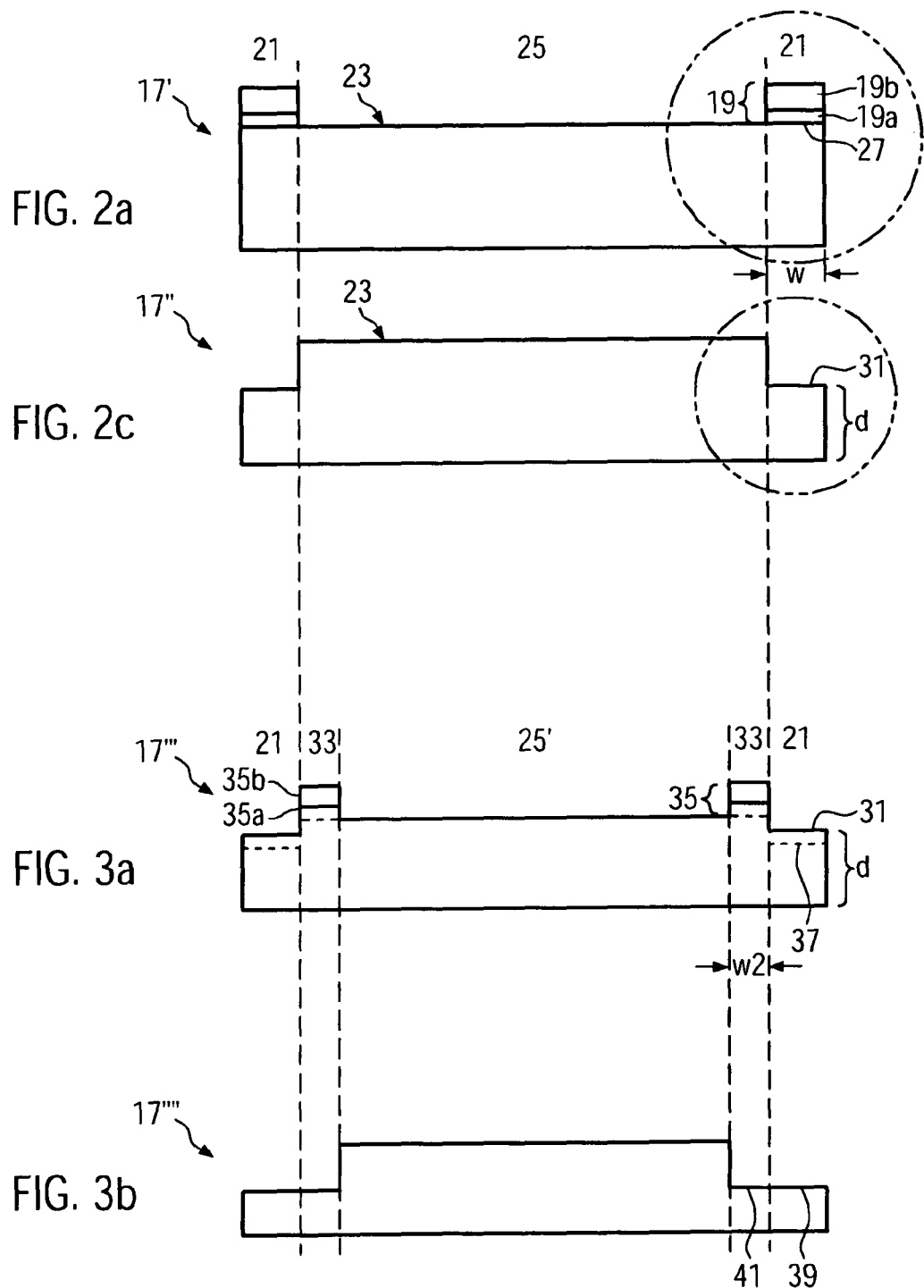

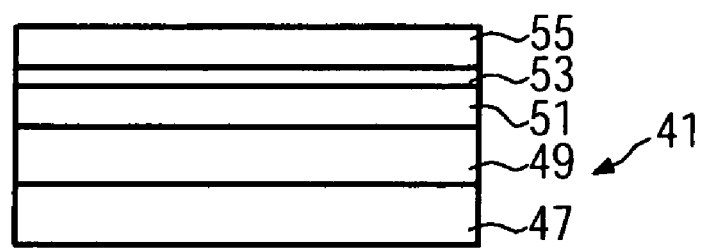
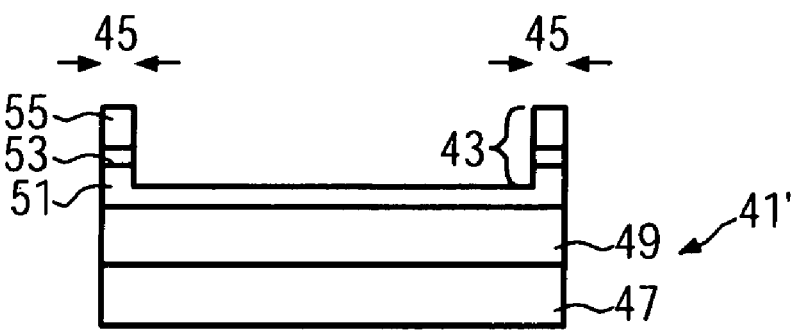

METHODS FOR RECYCLING SUBSTRATES AND FABRICATING LAMINATED WAFERS

CROSS-REFERENCE TO RELATED APPLICATIONS

This application is the national stage entry of PCT International Application Number PCT/EP2008/005107, filed Jun. 24, 2008, designating the United States of America and published in English as WO 2009/007003 A1 on Jan. 15, 2009, which PCT International Application is incorporated herein in its entirely by this reference. PCT International Application Number PCT/EP2008/005107 claims the benefit of European Patent Application 07290869.2, filed Jul. 11, 2007, now withdrawn, and European Patent Application 08290490.5, filed May 28, 2008, now European Patent 2037495.

The invention relates to a recycling method for a substrate with a step-like residue on a first region of its surface, in particular along the edge of the substrate, which protrudes from the surface with respect to a remaining second region of the substrate. The invention also relates to a laminated wafer fabricating method during which a layer is transferred from the recycled substrate onto another substrate. The invention furthermore relates to a recycled donor substrate.

The recycling of substrates, in particular semiconductor substrates used in the semiconductor technology, plays an important role in fabrication processes during which a layer, in particular a thin layer, is transferred from one substrate, typically called the donor substrate, onto another substrate, usually called the handle substrate, to form a transferred layer-handle compound. Recycling of the remainder of the donor substrate allows the reuse of the material of the donor substrate. By doing so, the new material costs can be kept low.

Wafer recycling is an advantage of the so-called SMART CUT® process, which can be used as a fabrication process for silicon on insulator (SOI) type wafers. FIGS. 1a to 1f illustrate schematically such a process for an SOI wafer, however, materials other than silicon, like silicon germanium (SiGe), can also be transferred by this method onto a handle substrate.

The donor substrate in this case is a silicon wafer 1 and the handle substrate onto which a layer from the donor substrate 1 will be transferred is a second silicon wafer 3. To provide the insulating layer in the final SOI structure, the donor substrate 1 is subjected to an oxidizing treatment to create an insulating layer 5 on, at least, the main surface of the donor substrate 1 at which attachment will occur later on (FIG. 1b). FIG. 1c illustrates the step of creating a predetermined splitting area 7 inside the donor substrate 1, which in the SMART CUT® process is achieved by implanting atomic species 9 into the donor substrate 1 to create the predetermined splitting area 7 that is essentially parallel to the main surface of the donor substrate 1 with its insulating layer 5.

The donor substrate 1 together with its insulating layer 5 and the predetermined splitting area 7 is then attached, in particular by bonding, to the second silicon wafer 3 (FIG. 1d) and then detached by carrying out a thermal treatment (or a mechanical/chemical treatment or a combination thereof) to thereby transfer a layer 11 from the donor substrate 1 together with the insulating layer 5 onto the handle substrate 3 (FIG. 1e). The results of the detachment step are then illustrated in FIG. 1f. Whereas the left-hand side illustrates the SOI substrate 13 with its transferred layer 11, its insulating layer 5 and the donor silicon substrate 3, the right-hand side illustrates the remainder 15 of the donor substrate 1.

The remainder 15 of the donor substrate typically presents a step-like residue along its edge, forming a collar or corona like structure 17 that is the result of an absence of attachment at the edge of wafers 1 and 3 during the bonding process. This is attributed to the edge roll off of the wafer, due to which the two wafers do not touch each other. Thus during detachment, the part of the surface of the donor substrate 1 that is attached to the handle substrate 3 is transferred, whereas the edge portion 17 remains with the remainder 15 of the donor substrate 1.

Prior to reuse of the remainder 15 of the donor substrate 1 in a subsequent fabrication run, it is necessary to remove the step-like residue 17 to planarize the substrate. To do so JP 11297583A proposes polishing of the remainder to remove the step on the periphery and a subsequent finish polishing of the entire surface. U.S. Pat. No. 7,022,586 B2 proposes to remove the step by various methods like the application of a laser beam, a jet stream of water, air or another fluid, by application of a shock wave or by bombarding the step-like residue with ions. Following the removal of the residue, the entire surface is polished. Also U.S. 2006/0115986 A1 discloses a selective removal of the residue by exposing the residue to an etchant while the circular recess itself is masked by a spin-on-glass. Alternatively a grinding process is proposed during which more pressure is applied to the circumferential portions where the residue is located than to the centre of the wafer. Finally, U.S. Pat. No. 6,596,610 B1 discloses a method of etching or heat treating the remainder of the wafer such that in case of a chamfered edge of the substrate all regions of the residue lying above the ion implanted zone are removed prior to reuse of the wafer in a subsequent fabrication run.

It was, however, observed that whenever recycled donor substrates were reused in the SMART CUT® process the surface of the donor substrate was contaminated following chemical or thermal treatment steps.

It is therefore the object of the present invention to provide a method for recycling a substrate that reduces the risk of surface contamination during subsequent layer transfer processes.

This object is achieved with the method for recycling a substrate with a step-like residue in a first region of its surface, in particular along the edge of the substrate, which protrudes with respect to the surface of a remaining second region of the substrate and wherein the first region comprises a modified zone in particular an ion implanted zone, essentially in a plane corresponding to the plane of the surface of the remaining second region of the substrate and/or chamfered towards the edge of the substrate, characterized in that a material removal is carried out in the first region so that, after removal, the surface of the substrate in the first region is at least partially, in particular completely, lying lower than the level of the modified zone before material removal. In contrast to all of the prior art methods during which the material removal stops at the level of the modified zone, the method according to the invention does not stop at the modified zone, but removes more material in the region of the step-like residue. This has the advantage that a contamination of the recycled donor substrate by remaining contaminating regions close to the implanted zone and which show defects which can contaminate the surface of the recycled donor substrate due to an uncontrolled detachment during subsequent thermal or chemical treatments, is greatly reduced.

In this context, "at least partially" means that at the edge of the substrate, in a part of the region being chamfered, a modified zone can eventually remain.

Preferably, the removal can be carried out such that the surface of the first region of the substrate after removal lies lower by at least 1 µm, preferably at least 2 µm, in particular 5 μm, even more in particular 10 μm, than the level of the modified zone prior to the removal. It appears that most of the contaminating regions are removed from the remainder of a substrate when a material volume with such a thickness is removed in the first region.

Advantageously, the removal can be carried out only in the first region. By limiting the method to the region of the substrate with the step-like residue, more precious material of the donor substrate remains, which is due to the absence of an additional polishing step like applied in the prior art, which polish off several μm of the complete front surface in order to remove the step-like residue and to obtain a flat and even surface.

According to a preferred embodiment, the method for recycling a substrate can comprise an additional material removal step, in case the substrate had already been subjected to at least a first recycling run and in which the first region of that substrate comprises a second modified zone, in particular a second ion implanted zone. In this embodiment, the additional material removing step is carried out such that material from the first region of the substrate is removed such that, after removal, the surface of the substrate in the first region is again lying lower than the level of the second modified zone. Thus again, a contamination from the contaminating regions close to the implanted zone can be prevented or at least reduced, so that the risk of unwanted detachments in subsequent process steps can be further reduced.

Preferably, the removal can be carried out such that the surface of the first region of the substrate is lying lower by at least 1 μm, preferably at least 2 μm, in particular 5 μm, even more in particular 10 μm, than the level of the second modified zone prior to the removal. Like above, it appears that most of the contaminating regions are removed from the remainder of a substrate when a material volume with a corresponding thickness is removed in the first region.

For the abovementioned embodiment, the second modified zone can extend laterally beyond the first region of the substrate into the second region of the substrate to thereby form a third region of the substrate and wherein, advantageously, the removal can be carried out such that the surface of the third region of the substrate is lying lower by at least 1 μm, preferably at least 2 μm, in particular 5 μm, than the level of the second modified zone at least in the first region prior to the removal. Advantageously, the third region can extend by at least 100 μm, in particular by at least 150 μm into the second region.

By not only removing material in the thickness direction of the substrate but also in the lateral direction, one takes into account the fact that once a substrate has already been recycled the problems of a lack of attachment between a donor and a handle substrate do not only occur at the edge, but also occur in the region close to the intersection between the first and the second region of the substrate, which is due to the step present on the recycled donor substrate.

Therefore, a new step-like residue is present in the third region which, to prevent the uncontrolled detachments in subsequent fabrication runs, again is advantageously removed according to the invention. The risk reduction concerning uncontrolled detachment and thus the reduced risk of surface contamination, counterweights the reduced surface area of the recycled donor substrate at which, in the subsequent fabrication run, attachment with a handle substrate can occur.

Advantageously, the removal can be carried out such that, after the removal, the level of the surface in the first and third regions is at the same level. Thus, the removal for the first and third regions can be realized in one process step.

According to a preferred embodiment, the method can be repeated at least once wherein after each recycling run, the modified zone extends laterally further into the second region of the substrate. As from run to run the region of the donor substrate from which material has not been transferred is growing, the lack of attachment between the donor and handle substrates moves more and more towards the centre of the substrate. By enlarging the region from which material is removed from run to run, it is ensured that the entire modified zone, typically modified by ion implantation, is removed to ensure that the risk of uncontrolled detachment remains low in the subsequent fabrication process steps.

Advantageously, the removal can be carried out by grinding. This method allows to selectively remove material from only a part of the substrate and is thus, well suited to carry out the inventive method. However, other methods like dry etching, wet etching or polishing may also be used.

According to a variant, etching can comprise providing a mask and/or a protective fluid over or on the surface of the second region and preferably flowing radially from the centre to the edge of the second region. Thus, an effective protection of the surface of the second regions can be achieved while at the same time etching of the first regions can be carried out.

Advantageously, an etching solution can be provided on the side opposite the side with the step-like residue and be guided, in particular by capillarity, to the first region 21 (FIG. 2A). Providing the etching solution on the backside facilitates the practical realisation and facilitates to limit the etching to the edge region of the substrate. This is particularly effective in combination with the mask and/or the protective fluid.

Preferably the substrate can be a silicon (Si), silicon germanium (SiGe), germanium (Ge), strained silicon or a III-V-type semiconductor, like GaAs, wafer. In particular, for expensive substrates like silicon germanium, the method is advantageous as the amount of material removed from the area at which attachment will occur is reduced. Thus, one wafer can be recycled more often. These materials can be used in a strained (tension or compression) or relaxed state.

The substrate can comprise an Si wafer, a buffer layer, in particular a graded SiGe buffer layer, and an SiGe layer. Preferably the substrate can furthermore comprise a strained-Si layer, at least in the protruding step-like residue. In particular, for Ge containing substrates it is important to remove the modified zone, as Ge atoms can get captured.

Preferably the method can further comprise a step of treating the entire surface, preferably by polishing, after the step of removing material of the first region. In this case, defects, which might be present at the surface can be removed to get the substrate ready for re-use. However, this additional step, does not have to remove a lot of material. Typically, 100 nm to 300 nm of material removal over the entire surface are sufficient.

The invention also relates to a laminated wafer fabricating method including the following steps: a) using the substrate recycled as a donor substrate as described herein, b) forming a predetermined splitting area inside the donor substrate, c) attaching, in particular by bonding, the donor substrate to a handle substrate, and d) detaching the donor substrate at the predetermined splitting area, such that a layer gets transferred from the donor substrate onto the handle substrate to form the laminated wafer. An example of this method has been described above with respect to FIGS. 1a to 1f. According to the invention, the laminated wafer fabricating method uses substrates which were recycled like described above. As the recycling method ensures that not only the modified zone itself is removed from the edge, but also material underlying the modified zone, the risk of contamination by dust particles originating from the above defined contaminating regions in the subsequent fabrication steps is reduced and thereby the risk of uncontrolled detachment during thermal or chemical treatments is reduced compared to prior art using recycled wafers.

Advantageously, steps a) to d) listed above are repeated at least once, each time using the same substrate from which during each run a layer has been transferred and which has been recycled after each run according to one of the above described recycling methods. Not only can more process runs be carried out on one substrate by applying this method, but at the same time, like previously mentioned, the risk of uncontrolled detachment is reduced in each fabrication run.

Preferably, the laminated wafer can be a strained silicon on insulator wafer or an SiGe on insulator wafer, wherein the donor substrate comprises a strained silicon layer and/or a silicon germanium layer. High-quality silicon germanium substrates are expensive so that it is important to realize a fabrication process during which the number of reuses of the donor substrate can be maximized by at the same time reducing the risk due to previously implanted ions.

The invention also relates to a recycled donor substrate comprising a recycled donor substrate having a first and a second region characterized in that the first region, in particular along the edge of the substrate, is lying lower than the second region of the substrate, in particular at least at the intersection between the first and second region of the substrate. For a donor substrate which has already served in a fabrication process like described in the introductory part of the application, the provision of the step-like surface indicates that all parts into which ions have been implanted previously, were removed in a manner which enables the fabrication of laminated wafers with a reduced risk of uncontrolled detachment.

Preferably, the surface of the first region can lie at least 2 μm, in particular 5 μm, even more in particular 10 μm lower than the surface of the second region. Typically, the modified zone like defined above with respect to the inventive methods lies at the same level as the surface in the second region of the substrate so that by removing at least a volume with a thickness of 2 μm in the first region, it is ensured that most of possible contaminants in that region are removed.

Advantageously, the first region can extend along the edge of the substrate and over at least 300 μm, in particular at least 500 μm, more in particular at least 1000 μm, and even more in particular at least 1500 μm in the lateral direction of the surface. This ensures that the entire region into which an ion implantation has been realized is removed, before the donor substrate is reused. Thereby the risk of uncontrolled detachment during a subsequent fabrication process during which a heat or chemical treatment is carried out can be prevented.

Preferably, the donor substrate can be a silicon (Si), strained silicon, silicon germanium (SiGe), germanium (Ge) or a III-V-type semiconductor, like gallium arsenide (GaAs), wafer. In particular, these substrates are used in layer transfer processes like the above described SMART CUT® process and therefore it is important to ensure that the risk of uncontrolled detachment is reduced. These materials can be used in a strained (tension or compression) or relaxed state.

Figure 5A:
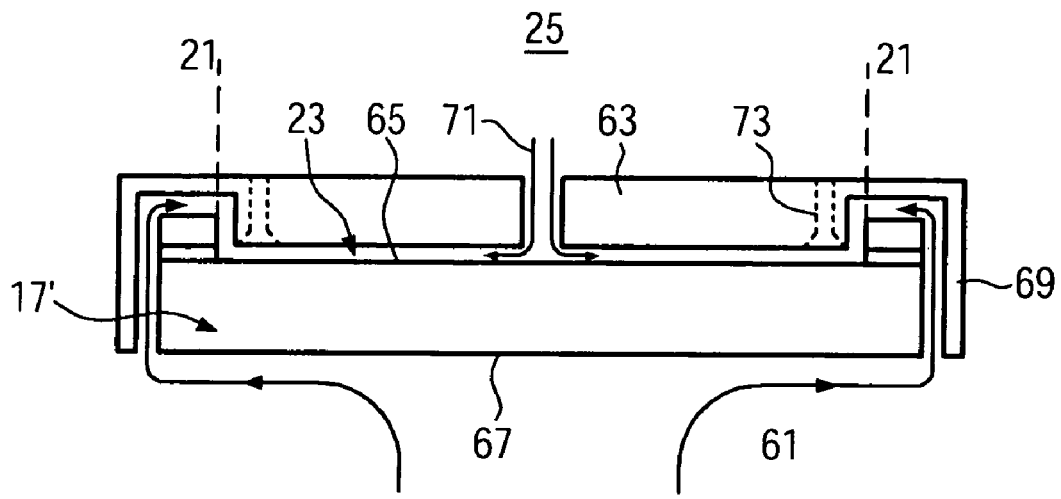
Figure 5B:
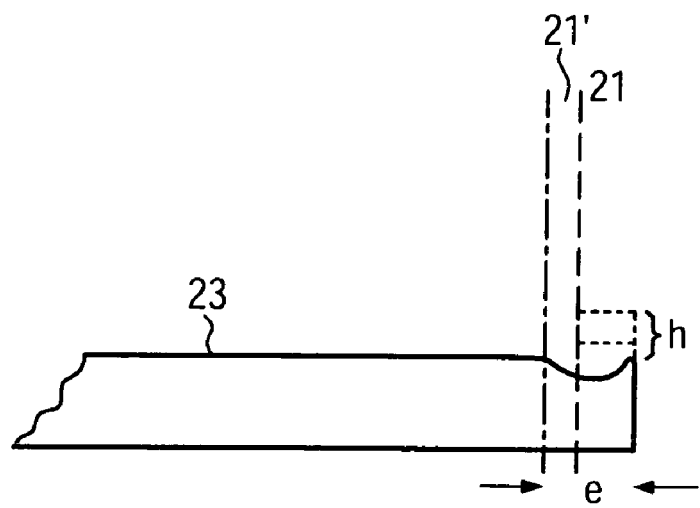

Embodiments of the present invention and their advantageous effects are described in the following description with reference to the accompanying figures, in which:

FIGS. 1a to 1f illustrate a conventional layer transfer process to fabricate a laminated substrate, here a SMART CUT® type process, FIGS. 2a to 2d illustrate a first embodiment of the inventive method, FIGS. 3a and 3b illustrate a second embodiment according to the invention, FIGS. 4a and 4b illustrate a third embodiment of the invention, and FIGS. 5a and 5b illustrate a wet-etching process according to the invention.

In the following, and throughout the application, it is always considered that the surface of the substrate, which is treated according to the invention, is on the upper side of the substrate. In this configuration, a surface lying higher than another one thus means that the thickness of the substrate in that region is larger than in the other region.

FIGS. 2a and 2b illustrate a first embodiment of the inventive method for recycling a substrate. FIG. 2a illustrates the substrate 17' prior to recycling, whereas FIG. 2b illustrates the same substrate 17" after recycling. Reference numerals, which have already been used in FIGS. 1a to 1f, are reused again, in case the features correspond to each other.

The substrates 17', 17" correspond to the remainder 17 of the donor substrate 1, like disclosed in relation to FIG. 1f, the corresponding description is incorporated herewith by reference. Thus, in this embodiment, the substrate 17' is a silicon wafer with a step-like residue 19 towards the edge of the substrate 17'. The region in which the step-like residue 19 is present is defined as being the first region 21. The surface 23 of a recess in between the step-like residue 19 is defined as the second region 25. The recess is the result of the layer transfer described in combination with FIGS. 1a to 1f.

FIG. 2a shows a side cut view of the substrate 17'. Thus the step-like residue 19 appears on the left- and right-hand side. When looking from the top onto the substrate 17', one would realize that the step-like residue 19 is present along the edge of the substrate 17 and thus, represents a collar- or corona-like structure.

The first region 21 of the substrate 17 furthermore comprises a modified zone 27 essentially in a plane corresponding to the plane of the surface 23 of the second region 25 of the substrate 17' and is typically slightly chamfered downwards towards the edge of the substrate, which is due to the edge roll off of the substrate.

The modified zone 27, represented with dotted lines, is an area in the first region 21 of the substrate 17 at which, during the layer transfer process, the SMART CUT® process, ions, in particular hydrogen and/or rare gas ions, have been implanted. Thus, the modified zone essentially corresponds to the predetermined splitting area 7 described above. Actually, also the step-like residue 19 is slightly chamfered towards the edge which, like already explained above, was the reason why in this region attachment between the handle substrate 3 and the donor substrate 1 did not occur, so that during ion implantation (FIG. 1c) also the modified zone 27 becomes slightly chamfered towards the edge.

This situation is illustrated in the enlarged view in FIG. 2b of the edge of the wafer. The edge roll off can have a height of typically several hundred μm and can even be as large as half the wafer thickness.

The step-like residue 19 actually comprises two layers, namely a silicon layer 19a and a silicon dioxide layer 19b, corresponding to the transferred layer 11 and the insulating layer 5 like described above with respect to FIGS. 1a and 1f. Therefore the height of the step-like residue 19 at the intersection between the first region 21 and the second region 25 typically corresponds to the thickness of the transferred layer 11 and the insulating layer 5 which have been transferred from the substrate 17 onto the handle substrate 3.

Typically a step-like residue has a thickness of about 200 nm, however, depending on the laminated wafer fabrication process and the desired end structure, this thickness might vary but typically remains in a range of 50 nm to 1800 nm. In the lateral direction of the surface, the first region 21 has a width w of at least 300 μm, in particular at least 500 μm, more in particular at least 1000 μm, and even more in particular at least 1500 μm.

Due to the presence of the step-like residue 19, substrate 17' cannot be directly reused in a laminated wafer fabricating process as described above with respect to FIGS. 1*a* to 1*f*. According to the invention a recycling process is realised during which a material removal process step is carried out to remove the step-like residue 19. The material removal is a grinding process, which has the advantage that grinding is efficient, fast, independent of the materials to be ground and does not need any protection of the front face of the donor, but other material removal processes like wet and dry etching could be applied. The etching process has the advantage that the residuals of implanted zones on the extreme lateral edge of the donor are easily removed. Moreover, dry etching is also very precise.

In case wet-etching is applied to remove the step-like residue 19, the following advantageous wet-etching procedure is applied according to a variant of the invention. The process is illustrated in FIG. 5*a*. To limit an etchant solution 61 to attack only the edge region of substrate 17'—for the detailed description of the properties and features of substrate 17' the description of FIG. 2*a* is herewith incorporated by reference—a mask 63 is brought close to the front side 65 of the substrate 17', such that the etchant solution 61 essentially attacks in the edge region 21 of the substrate 17'.

In this embodiment, the etchant solution 61 is applied via the backside 67. Using a capillarity effect between the edge of the substrate 17' and a lateral extension 69 of the mask 63, the etching solution 61 reaches region 21 and material removal limited to this region can be achieved.

The mask 63 is configured such that close to the transition between region 25 and 21, in particular within at most 1 to 2 μm towards the transition between regions 25 and 21, the mask 63 can come into contact with the surface 23 of the second region. Thus an attack of the surface 23 of the second region 25 by the etching solution can effectively be prevented.

Instead of using the mask 63 or in addition, a protective fluid 71 is provided which sweeps over the surface 23 to protect from the etching solution 61. The fluid 71 is typically provided in the centre region and the flows towards the edge of the substrate 17'. It can be removed from the surface 23 via bores 73 (dotted lines) close to the transition between regions 25 and 21. Thus on the surface side 65 the two flows 61 and 71 are in opposite directions which further protects region 25 from the attack of the etching solution 61.

Optimized results with respect to the depth of etching can be achieved by controlling the various possible process parameters. In particular, the choice of the fluid 71 is important. The fluid 71 can be a liquid, e.g. diluted water (DIW), or a gas, e.g. Nitrogen, Argon, isopropylalcohol, IPA or any mixture thereof. The flow of fluids 61 and 71 is chosen to be in a range from about 100 up to 5000 sccm. Also the rotational speed of substrate 17' can play a role and is chosen between 100 up to 3000 rpm. Finally, the process time itself plays an important role and can be used to control the process.

FIG. 5*b* illustrates the result of the wet etching process shown in FIG. 5*a*. Dashed lines indicate the situation before etching (thus like in FIG. 5*a*), whereas the plain lines illustrate the substrate 17", thus after etching. Material has been removed in a region 21' which corresponds to region 21 or is slightly, in particular by 1 μm up to 2 μm, larger (like illustrated) than region 21. The lateral extend "l" depends on where the mask 63 is in contact with surface 23 but also on the fluids used. Whereas in the case of gaseous fluids the lateral extend l of region 21' is essentially determined by the mask, the lateral extend can be changed by using a liquid fluid. Due to a dilution effect with the etchant solution 61, the lateral extend "l" is shorter than in case of the gaseous fluid. Furthermore process time, typically from 5 to 15 min, can be used to control the height "h" of removed material.

The result of this material removal step is illustrated in FIG. 2*c*. Unlike in the prior art, the material removal does not stop at the level of the modified zone 27, but continues to remove more material so that, after removal the surface 31 of the substrate 17" in the first region 21 is lying lower than the level of the modified zone 27 before the material removal in substrate 17'. Thus, the substrate 17" still has a step-like surface structure, however, now with an inverted situation in which the surface 23 of the second region 25 lies above the surface 31 of the first region 21.

According to the invention, the removal is carried out such that the surface 31 of the first region 21 of the substrate 17" is at least 1 μm, preferably at least 2 μm, in particular 10 μm lower than the level of the modified zone 27 prior to the removal.

As can be seen from FIG. 2*c*, the material removal has only been carried out in the first region 21 which brings the advantage that the thickness of the substrate 17" in the second region 25 is not reduced, thus the number of reuses of the donor substrate 17" can be optimized.

Eventually, in particular, in case that after the material removing, like the grinding, a part of the modified zone 27 remains at the edge of the donor substrate 17" due to the edge roll off (see FIG. 2*d*), or if the ground surface has too many defects, additional process steps like etching (dry or wet) and/or edge polishing and/or thermal treatments could be carried out.

The method according to the first embodiment has the advantage that during subsequent uses of the substrate in a laminated wafer fabrication process as described with respect to FIGS. 1*a* to 1*f*, the risk of an uncontrolled detachment during a thermal or chemical treatment can be reduced. This is attributed to the fact that by removing more material from the first region compared to the prior art, the risk of contamination from contaminating regions in the first region which are attributed to regions with defects close to the modified zone and which might pollute the donor substrate during subsequent thermal and/or chemical treatments can be reduced.

FIGS. 3*a* and 3*b* illustrate a second embodiment of the inventive method for recycling a substrate. FIG. 3*a* illustrates a substrate 17''' which has been achieved by using substrate 17" illustrated in FIG. 2*b* as donor substrate 1 in the laminated wafer fabrication process as described with respect to FIGS. 1*a* to 1*f*. Reference numerals, which have already been used in FIGS. 1*a* to 1*f*, are reused again, in case the features correspond to each other.

Substrate 17''' comprises the first region 21 with its low-lying surface 31. In the first region 21 the thickness d of substrate 17''' essentially corresponds to the thickness d in the first region 21 of the substrate 17" shown in FIG. 2*b*, as no material transfer occurred in the first region 21, which is due to the low lying surface 31. Actually, no attachment occurred with the handle substrate 3 (in the step illustrated in FIG. 1*d*). Directly neighbouring the first region 21, the substrate 17"' comprises a third region 33 with a second step-like residue 35 corresponding to the edge region of substrate 17" which, in addition to the first region 21, could not attach to the handle substrate 3 during the process step illustrated in FIG. 1*d*. This lack of attachment is typically attributed to an edge roll off, being the result of previous surface treatment steps.

Next to the third region 33, towards the centre of the substrate 17'', is situated the region from which a layer (see layer 11 in FIG. 1f) was transferred and which corresponds to a modified second region 25', which is less extended than the second region 25 illustrated in FIGS. 2a and 2b.

The dashed lines present in the first and third regions 21, 33 illustrate a second modified zone 37 essentially corresponding to the region with implanted ions, which were previously implanted during the predetermined splitting area formation step of the laminated wafer fabricating process illustrated in FIG. 1b. As attachment to the handle substrate 3 did not occur in the first and third regions 21 and 33, no detachment occurred so that the modified zone 37 remains in substrate 17''' just like the modified zone 27 remained in substrate 17' illustrated in FIG. 2a.

Typically, the second step-like residue 35 has a width w2 of at least 100 µm, in particular about 150 µm, and a height corresponding to the thickness of the transferred layer 11 and the insulating layer 5, thus about 200 nm. As a consequence, also the step-like residue 35 comprises two layers, a silicon layer 35a and an insulating layer, here silicon dioxide, 35b just like also illustrated in FIG. 2a concerning the first embodiment.

FIG. 3b now illustrates the result of a second supplementary material removal process step, similar to the first one, during which material is removed from the first and third regions 21, 33 such that, after removal, the surfaces 39 and 41 in the first and third regions 21, 33 respectively, lie lower than the level of the second modified zone 37 prior to material removal.

In this embodiment, surfaces 39 and 41 are on the same level, however, they could be at different heights as long as the levels are below the level of the second modified zone 37, so that, like in the first embodiment, enough material has been removed in the first and third regions 21, 33 to reduce the risk of uncontrolled detachment, as contaminating regions linked to defects in regions close to the implanted zone in the second modified zone 37 in subsequent laminated wafer fabrication runs are essentially removed. Typically, the material removal is carried out such that the surface of the first and/or third regions of the substrate 17''' is lying lower by at least 1 µm, preferably at least 2 µm, in particular 5 µm, than the level of the second modified zone 37 prior to the material removal.

Also in this embodiment, the material removal is restricted to the first and third regions 21, 33 so that no material removal occurs in the central zone 25' so that the number of reuses remains optimized.

In the second embodiment with the additional material removal, the same advantageous effect as for the first embodiment can be achieved. Preferably the first and second embodiments can be combined.

According to a variant of the first embodiment, the step-like residue 19 does not comprise two layers, namely a silicon layer 19a and a silicon dioxide layer 19b, but only a silicon layer 19a. This situation may occur when the insulating layer 5 is not provided on the donor substrate 1 (see FIG. 1b) but on the handle substrate 3. Also according to a variant of the second embodiment, the second step-like residue 35 does not comprise two layers, the silicon layer 35a and the insulating layer 35b, but again only the silicon layer 35a, e.g. in case the insulating layer is provided on the handle substrate.

According to further variants of the first and second embodiments, additional process steps could be carried out during the recycling method. These additional process steps can comprise polishing steps to remove defects from the surface of the substrates and/or additional thermal treatments. Here, it is preferable to polish 100 nm to 300 nm, but it is not necessary to polish several µm like in the processes known from the prior art.

The FIGS. 2c, 2d, 3a and 3b illustrate surfaces 23 and 31 which are essentially in parallel. However, the material removal process could also be carried out such that the angle between surface 23 and 31 is different to zero, so that the surfaces are chamfered with respect to each other. The angle between surface 31 and 23 could for example go up to 45°. In this case it is ensured that the modified zones at the edge are removed.

Like already mentioned above for the first and second embodiments, the recycled substrates 17'' and 17''' are used according to the invention in laminated wafer fabrication methods, like the one described with respect to FIGS. 1a to 1f. This brings the advantage that during the laminated wafer fabrication process the risk of an uncontrolled delamination is reduced by essentially removing the contaminating regions close to implanted regions. This risk reduction counter-weights the loss of material which can be transferred due to the material removal, which laterally grows from recycling run to recycling run of the donor substrate. In fact, for each recycling run the width of the region in which material is removed grows by about 150 µm.

FIGS. 4a and 4b represent a third embodiment of the invention and illustrate a donor substrate 41, 41' which has been used in a SMART CUT® type laminated wafer fabricating process and therefore, just like the donor substrate 17' illustrated in FIG. 2a, represents a step-like residue 43 in a first region 45 at the edge of the substrate 41.

Unlike the first and second embodiments, in this embodiment not a silicon wafer serves as the donor substrate but a structure, which is used to obtain strained SOI wafers. Substrate 41 comprises a silicon bulk wafer 47 on which a graded silicon germanium buffer 49 is provided in which the concentration of germanium grows with the thickness of the layer to continuously change the lattice constant in the buffer layer 49. A silicon germanium layer with a concentration of about 20% germanium 51 is provided on the buffer layer 49, over which in turn a strained silicon layer 53 is provided. This silicon layer 53 is strained, as it is grown on a layer with a different lattice constant.

In such a structure, a TEOS layer 55 is used as insulating layer 3, instead of a thermal insulating layer, like illustrated in FIG. 1b. After layer transfer the substrate 41' has the structure as illustrated in FIG. 4b and the step-like residue 43 which corresponds to that part of substrate 41 which has not been transferred onto a handle substrate, comprises a remaining part from the TEOS insulating layer 55, a part from the strained silicon layer 53 and a remaining small part of the silicon germanium 20% layer 51. A modified zone 57 comprising the implanted ions is present at a level corresponding to the recess 59. This substrate is then recycled just like described with respect to FIGS. 2a and 2b, so that also such a substrate can take advantage of the inventive method, namely that the risk of an uncontrolled detachment due to contaminants present in the modified zone 57 can be reduced. In addition, the invention brings the advantage that by removing the modified zone, defects are removed, which could otherwise capture Ge atoms, in case one or more layers contain Ge. Then of course once recycled and reused in a strained SOI fabrication process comprising an ion implantation step, the obtained structure undergoes a further recycling treatment with the supplementary material removal step, as illustrated in FIGS. 3a and 3b.

Instead of strained SOI type substrates the invention could also be applied to a substrate which terminates with the silicon germanium 20% layer and over which the insulating layer 5 can be directly provided (see FIG. 1*b*).

Like in the first and second embodiments, also in the third embodiment the insulating layer 55 could be provided on the handle substrate 3 instead of on the strained silicon layer 53 itself.

Furthermore, preferably the SiGe layer 51 is sufficiently thick such that after detachment of the strained silicon layer 53 there is no need for regrowing the SiGe layer to its initial thickness, but it will be sufficient to grow a new strained Si layer on the remaining SiGe layer 51 so that the donor substrate can be reused.

The invention claimed is:

1. A method for recycling a substrate, comprising:
   providing a substrate having a step-like residue in a first region of the substrate extending along an edge of the substrate, the first region of the substrate having a surface protruding relative to a surface of a second region of the substrate, the first region of the substrate comprising an ion implanted zone in a plane corresponding to a plane of the surface of the second region of the substrate; and
   removing material from the first region of the substrate and causing the surface of the first region of the substrate to lie lower than the plane in which the ion implanted zone was disposed prior to removing the material from the first region of the substrate, and causing the surface of the first region of the substrate to lie lower than the second region of the substrate.

2. The method of claim 1, wherein removing material from the first region of the substrate further comprises causing the surface of the first region of the substrate to lie lower than the plane in which the ion implanted zone was disposed prior to removing the material from the first region of the substrate by at least one micron (1 μm).

3. The method of claim 1, wherein removing the material from the first region of the substrate further comprises removing material from only the first region of the substrate.

4. The method of claim 1, further comprising:
   forming a second ion implanted zone in the substrate after removing the material from the first region of the substrate;
   transferring a portion of the substrate in the second region of the substrate to a handle substrate after forming the second ion implanted zone in the substrate;
   removing additional material from the first region of the substrate and causing the surface of the first region of the substrate to lie lower than a location of at least a portion of the second ion implanted zone prior to removing the additional material from the first region of the substrate.

5. The method of claim 4, wherein removing additional material from the first region of the substrate further comprises causing the surface of the first region of the substrate to lie lower than the second plane in which the second ion implanted zone was disposed prior to removing the additional material from the first region of the substrate by at least one micron (1 μm).

6. The method of claim 4, wherein removing additional material from the first region of the substrate further comprises removing material from a third region of the substrate between the first region and the second region and causing a surface of the third region of the substrate to lie lower than a location of at least a portion of the second ion implanted zone in the first region of the substrate prior to removing the material from the third region of the substrate by at least one micron (1 μm).

7. The method of claim 6, further comprising forming the third region of the substrate to extend from the first region of the substrate toward the second region of the substrate by at least one-hundred microns (100 μm).

8. The method of claim 6, further comprising forming the surface of the first region of the substrate and the surface of the third region of the substrate to be on a same level.

9. The method of claim 6, further comprising repeating the actions of forming another ion implanted zone in the substrate, transferring a portion of the substrate to a handle substrate after forming the another ion implanted zone in the substrate, and removing additional material from at least the first region of the substrate and causing the surface of the first region of the substrate to lie lower than a location of at least a portion of the another ion implanted zone prior in the first region of the substrate prior to removing the additional material from at least the first region of the substrate.

10. The method of claim 1, wherein removing the material from the first region of the substrate comprises at least one of grinding, dry etching, wet etching, and polishing.

11. The method of claim 10, wherein removing the material from the first region of the substrate further comprises:
    providing at least one of a mask and a protective fluid over the surface of the second region of the substrate; and
    etching material from the first region of the substrate while the at least one of a mask and a protective fluid is over the surface of the second region of the substrate.

12. The method of claim 11, further comprising providing an etching solution on a side of the substrate opposite a side of the substrate having the step-like residue thereon and guiding the etching solution to the first region of the substrate by capillarity.

13. The method of claim 1, wherein providing the substrate further comprises selecting the substrate to comprise one of an Si wafer, an SiGe wafer, a Ge wafer, a GaAs wafer, a strained silicon wafer, and a III-V-type semiconductor wafer.

14. The method of claim 13, wherein providing the substrate further comprises selecting the substrate to comprise an Si wafer including a graded SiGe buffer layer and an SiGe layer.

15. The method of claim 14, further comprising forming the substrate to comprise a strained-Si layer at least in the step-like residue.

16. The method of claim 1, further comprising polishing an entire surface of the substrate including the surface of the first region and the surface of the second region after removing the material from the first region of the substrate.

17. A method of fabricating a laminated wafer, comprising:
    providing a recycled donor substrate, comprising:
        providing a donor substrate having a step-like residue in a first region of the donor substrate extending along an edge of the donor substrate, the first region of the donor substrate having a surface protruding relative to a surface of a second region of the donor substrate, the first region of the donor substrate comprising an ion implanted zone in a plane corresponding to a plane of the surface of the second region of the donor substrate; and
        removing material from the first region of the donor substrate and causing the surface of the first region of the donor substrate to lie lower than the plane in which the ion implanted zone was disposed prior to removing the material from the first region of the donor substrate, and causing the surface of the first region of the substrate to lie lower than the second region of the substrate;

forming a predetermined splitting area inside the donor substrate;

attaching the donor substrate to a handle substrate; and detaching the donor substrate at the predetermined splitting area and transferring a layer from the donor substrate onto the handle substrate to form the laminated wafer.

18. The method of claim 17, further comprising:

forming another predetermined splitting area inside the donor substrate after forming the laminated wafer;

attaching the donor substrate to another handle substrate; and detaching the donor substrate at the another predetermined splitting area and transferring another layer from the donor substrate onto the another handle substrate to form another laminated wafer.

19. The method of claim 17, further comprising:

selecting the donor substrate to comprise at least one of a strained silicon layer and an $Si_xGe_{1-x}$ layer, wherein x is between 0 and 100;

and forming the laminated wafer to comprise at least one of a strained silicon on insulator wafer and an $Si_xGe_{1-x}$ on insulated wafer.

* * * * *